United States Patent [19]

Hatzakis

[11] 4,087,569

[45] May 2, 1978

[54] PREBAKING TREATMENT FOR RESIST MASK COMPOSITION AND MASK MAKING PROCESS USING SAME

[75] Inventor: Michael Hatzakis, Ossining, N.Y.

[73] Assignee: International Business Machines Corporation, Armonk, N.Y.

[21] Appl. No.: 752,949

[22] Filed: Dec. 20, 1976

[51] Int. Cl.² ............................................. B05D 3/06
[52] U.S. Cl. ...................................... 427/43; 96/35.1; 96/36.2; 96/115 R; 427/273; 427/372 R
[58] Field of Search ................... 427/43, 44, 385, 273, 427/372 R; 96/35, 35.1, 15 R, 36.2; 528/481, 503; 204/159.14

[56] References Cited

U.S. PATENT DOCUMENTS

| | | | |
|---|---|---|---|
| 3,594,243 | 7/1971 | Deutsch et al. | 96/35.1 X |
| 3,706,703 | 12/1972 | Heilman | 528/503 X |
| 3,914,462 | 10/1975 | Morishita et al. | 427/43 |
| 3,935,331 | 1/1976 | Poliniak et al. | 427/43 |
| 3,984,582 | 10/1976 | Feder et al. | 427/43 |

OTHER PUBLICATIONS

IBM Tech. Disclosure Bulletin, vol. 18, No. 8, Jan. 1976, Bargon et al., p. 2622.
IBM Tech. Disclosure Bulletin, vol. 19, No. 4, Sep. 1976, Bargon, p. 1402.

*Primary Examiner*—John H. Newsome
*Attorney, Agent, or Firm*—Graham S. Jones, II

[57] ABSTRACT

Polymethyl methacrylate methacrylic acid (P[MMA/MAA]) copolymer powder is prebaked above 200° C. The prebaked powder is dissolved in a suitable casting solvent. The insoluble material produced during prebaking is removed by filtration. Then the solution remaining is applied to a substrate, post-baked at a temperature less than or equal to the prebaking temperature to drive off the solvent, exposed to electron beam radiation, and developed in a developing solvent.

7 Claims, No Drawings

PREBAKING TREATMENT FOR RESIST MASK COMPOSITION AND MASK MAKING PROCESS USING SAME

BACKGROUND OF THE INVENTION

1. Field of the Invention

This invention relates to coating processes involving direct application of electrical, magnetic or wave energy and, more particularly, to irradiation of selected areas to produce a pattern.

2. Description of the Prior Art

Radiation-sensitive resist films are applied to substrates for the purpose of exposure to a pattern of radiation which can produce a desired pattern upon development of the resist. Resist films have been baked prior to exposure in order to remove the solvent used to apply the resist films to the substrate. It has been found that such prebaking yields cross-linking of polymers which results in poor quality images of the exposed patterns when the resists are developed.

U.S. Pat. No. 3,535,137, issued October 20, 1970 to Haller et al from U.S. Pat. application Ser. No. 609,145, filed Jan. 13, 1967 and entitled "Method of Fabricating Etch Resistant Masks" teaches a process for preparing a poly(methyl-methacrylate) resist among others using a process involving 1) dissolving a resist polymer in a suitable solvent, 2) forming a thin polymer film by spinning a drop of dissolved polymer onto a substrate surface and, 3) dry baking the polymer film for a time to a temperature sufficient to improve adhesion and handling characteristics of the film, 4) exposing selected portions of the polymer to electron beam radiation to reduce the average molecular weight of the selected portions, 5) fractionating, in situ, the selected portions by applying a developer which selectively removes the exposed polymer, 6) baking the remaining polymer for a sufficient length of time at a sufficient temperature to eliminate undercutting resulting from lateral spreading of radiation during exposure, 7) etching the underlying substrate with a desired etchant through the openings formed where the exposed polymer has been removed.

U.S. Pat. No. 3,984,582 issued Oct. 5, 1976 to Feder et al from U.S. patent application Ser. No. 591,980, filed June 30, 1975, entitled "Method for Preparing Positive Resist Image" teaches use of copolymers of a material containing polymerized methyl methacrylate with methacrylic acid (P[MMA/MAA]) as a high sensitivity resist. In this case, the process steps involve 1) coating a solution of a polymeric resist upon a substrate by spin casting or dipping and then drying to remove volatile material, 2) preferably, prebaking the polymeric film in air or in a vacuum at a temperature above the glass transition temperature of the polymeric material but below the thermal decomposition temperature of the material to remove any remaining solvent, at a temperature preferably in the 160° C to 220° C range, 3) exposing the coated substrate to an electron beam image with charge densities as low as $2 \times 10^{-6}$ coul/cm$^2$, 4) treating the polymeric film to a swelling agent to swell only the exposed portions from about 3 to 60 minutes, 5) applying a nonsolvent liquid to the polymeric film to remove the exposed portions, ultrasonically or by spraying.

One of the most important of the above steps in the preparation of the copolymers in U.S. Pat. Nos. 3,535,137 and 3,984,582 for exposure to an electron beam or other ionizing radiation is the prebaking of the resist solution only after applying it to the workpiece. The baking at temperatures of 160° C to 220° C changes the solubility of the copolymer in U.S. Pat. No. 3,984,582 and improves adhesion to the substrate unlike the homopolymer of PMMA in U.S. Pat. No. 3,535,137 where baking is used only for the purpose of evaporating the solvent.

The change in solubility of the copolymer resist is large and is highly dependent upon the temperature applied and the duration of its application. Accordingly, control of temperature and its duration when using this process must be very precise in order to maintain repeatability of the resist sensitivity and development times for all samples.

Ways in which changes in the P(MMA/MAA) copolymers occur during baking at temperatures below 300° C are given in a publication of Jamieson et al entitled "The Thermal Degradation of Copolymers of Methyl Methacrylate with Methacrylic Acid" in the Eurpoean Polymer Journal, Vol. 10, pp. 217–225, Pergamon Press, 1975. Most of the changes involve transformation from P(MMA/MAA) to methacrylic anhydride, either by acid-to-acid reactions with the formation of water, P(MMA/MAA)

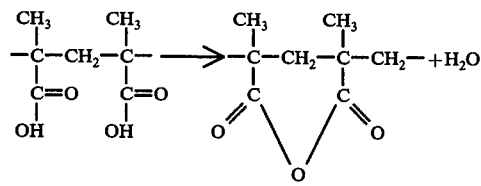

or by ester-to-acid reactions with loss of methanol,

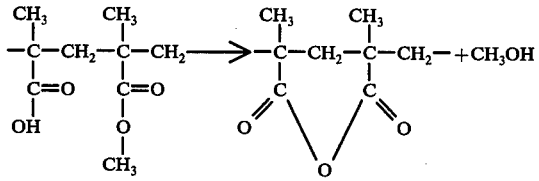

These reactions result in a three-component structure, i.e., terpolymer, consisting of methyl methacrylate/methacrylic acid/methacrylic anhydride chains. Thus, baking of the copolymers produces a chemical change which produces the terpolymers. The degree to which these chemical changes occur will depend upon time and temperature.

In addition to the above reactions, main chain cross-linking can occur during baking (as shown by the dotted line),

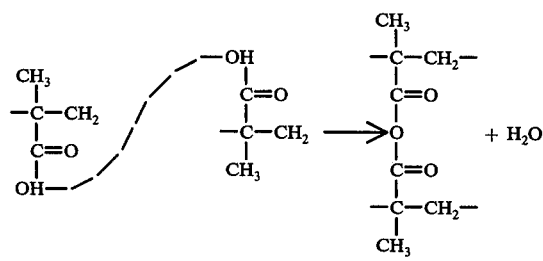

The latter reactions increase the molecular weight of the resist. If long chains are formed, insoluble particles are produced which remain as a residue after resist development.

In summary, baking of the copolymer resists in film form on a workpiece at temperatures from 160° C to 220° C (below 300° C) yields chemical changes which determine the solubility of the exposed and unexposed resist in the developer solution. To achieve repeatable results from sample to sample, the baking temperature and time must be controlled very carefully. Furthermore, baking of a polymeric film on a workpiece causes cross-linking, etc., which results in producing insoluble particles which will leave an insoluble residue on the substrate even when the exposed areas are developed with a strong solvent, such as ethyl Cellosolve acetate (ECA). (Cellosolve is a trademark of Union Carbide Chemical Corporation for the mono and dialkyl ethers of ethylene glycol and their derivatives.)

SUMMARY OF THE INVENTION

In accordance with this invention, a method is provided for the production of a resist image. A dry powder of a radiation-sensitive polymeric material comprising polymethyl methacrylate/methacrylic acid copolymer is prebaked at a first temperature. Solvent for the polymeric material is added to the product yielded by the step of prebaking to provide a solution of the polymeric material and an insoluble residue material. Some of the solution of polymeric material is deposited upon a substrate without any of the insoluble residue and a thin film of the polymeric material is formed on the substrate. Then the substrate and the film are baked at a temperature less than or equal to the first temperature and above the evaporation point of the solvent for a predetermined period of time sufficient to dry the polymeric film at the evaporation temperature. Then the polymeric film is exposed to a predetermined pattern of radiation, after which the polymeric film is developed.

Further in accordance with this invention, subsequent to adding the solvent, the solution is filtered prior to the coating step.

Still further in accordance with this invention, the polymeric film is devloped in a developing solvent.

In another aspect of this invention, the powder is prebaked at a temperature below the decomposition temperature of the copolymer in the range between 200° C and the decomposition temperature of the copolymer. Still further, it is preferred that the powder be prebaked at a temperature of 220° C or 230° C.

An object of this invention is to provide a new process for making photosensitive polymeric films having a reduced amount of insoluble particles and residue in order to provide improved images.

Another object of this invention is to facilitate the dissolving of exposed portions of resist during the step of development of a resist.

DESCRIPTION OF THE PREFERRED EMBODIMENT

In order to provide a new polymeric solution which contains less insoluble residues attributable to cross-linking and other chemical changes, the process described in U.S. Pat. No. 3,984,582 is modified by prebaking of a copolymer resist in a dry powder form prior to dissolving the dry powder in a chemical solvent for the dry polymeric powder. The dry powder is baked at a temperature higher than that which is required to bake the solution formed into a polymeric film after it has been applied to a substrate. After the step of prebaking the dry resist powder, the resulting product of that step is dissolved in a suitable solvent of the polymeric material which can be used to form it into a photosensitive film which can record an image of radiation applied to it.

Then the dissolved powder is preferably filtered to remove all insoluble residue.

Next the solution of polymeric material is applied to a substrate to form a film, preferably by spin coating. Then, it is baked for a time appropriate for a predetermined drying temperature less than or equal to the prebaking temperature during which the solvent for the polymeric film is driven out of the film.

Then the resist is exposed to radiation which has a predetermined pattern. Finally, the resist is developed by a suitable solution and the pattern exposed is delineated by the removed material. A minimum of insoluble residue remains.

The following examples are provided to demonstrate the present invention:

EXAMPLE I

A P[MMA/MAA] solution of polymerized 75/25 copolymer resist was prebaked at 230° C for one hour in powder form. Then, the resist was dissolved in a coating solvent of ECA filtered in a fritted Pyrex filter and applied to a substrate by spinning at 2000 RPM. The resulting film was baked at 160° C for one hour. The film was exposed to an electron beam of 25 kv accelerating voltage at $10^{-5}$ coul/cm$^2$. The result in solubility rate (S) and solubility rate ratio S/So* (*solubility rate ratio, S/So, is defined as the solubility rate S of the exposed region of resist over the solubility rate So of the unexposed region) at $10^{-5}$ coul/cm$^2$ and 25 kv is S = 2000 A/min in ECA and S/So = 6. The resulting image was developed in a solution of ethyl Cellosole acetate (ECA) and ethanol.

EXAMPLE II

The same film as in Example I was baked for 30 minutes at 200° C and the results were S = 2500 A/min and solubility rate ratio, S/So = 6, which was almost exactly the same as in the case of the 160° C film baking conditions shown in Example I. Nonpowder baked resist was cast from the same solvent and film baked at 200° C for one hour. It had a solubility S = 250 A/min in ECA and a solubility rate ratio of S/So = 2 at $10^{-5}$ coul/cm$^2$, 25 kv exposure, developed in the same mixture of ECA and ethanol.

EXAMPLE III

A similar experiment to that of Example I was conducted with powder prebaking at 220° C with the substitution of ESSCHEM #35777, 80/20 copolymer of methyl methacrylate and methacrylic acid with very similar results. The solubility rate S was 1900 A/min in ECA and the solubility rate ratio S/So was 5.5 at $10^{-5}$ coul/cm$^2$, 25 kv exposure, using the same mixture of ECA and ethanol. The film was baked at 160° C.

EXAMPLE IV

A similar experiment to that in Example II was conducted with powder prebaking at 220° C with the substitution of ESSCHEM π35777, 80/20 copolymer of methyl methacrylate and methacrylic acid with very similar results. The solubility rate S was 1700 A/min, and the solubility rate ratio S/So was 5.5 at $10^{-5}$ coul/cm², 25 kv exposure, using the same mixture of ECA and ethanol. The film was baked at 200° C.

EXAMPLE V

Experiments with ECA with 200° C and 160° C film baking for one hour with both above resists, with no powder baking, have shown that the solubility rate of the 200° C baked film is at least 2.5 times lower that the solubility rate of the 160° baked film, thereby demonstrating the dependence of solubility rate on the film baking temperature when no powder prebaking is used. As was shown in Examples I, II, and III above, this dependence is virtually eliminated if powder prebaking at 230° C is used. Experiments with other solvents such as ethyl Cellosolve (EC) and methyl Cellosolve (MC) have shown similar results.

The polymeric powder in the form of a solution, emulsion, or any other form of polymerized copolymer of methyl methacrylate and methacrylic acid in proportions by weight of 99/1 to 50/50 as described in U.S. Pat. No. 3,984,582 is useful as raw material for this process.

What is claimed is:

1. A method for the production of a resist image comprising the steps of:

prebaking a dry powder of a radiation-sensitive polymeric material comprising polymethyl methacrylate/methacrylic acid copolymer at a first temperature below the decomposition temperature, adding a solvent for said polymeric material to the yield of said prebaking step to produce a solution of said polymeric material and an insoluble residue, then separating said solution from said residue and retaining said solution, coating only said solution of polymeric material without said residue upon a substrate to form a thin polymeric film of said polymeric material, post-baking said substrate and said polymeric film at a second temperature less than or equal to said first temperature and above the evaporation point of said solvent for a predetermined time required for drying said polymeric film at said second temperature, exposing said polymeric film to radiation in a predetermined pattern, and developing said polymeric film.

2. A method in accordance with claim 1 wherein subsequent to adding said solvent, said solution is filtered prior to said coating step.

3. A method in accordance with claim 1 wherein said polymeric film is developed in a developing solvent.

4. A method in accordance with claim 1 wherein said powder is prebaked at a temperature in the range between 200° C to the decomposition temperature of said copolymer.

5. A method in accordance with claim 1 in which said powder is prebaked at a temperature below the decomposition temperature of said copolymer.

6. A method in accordance with claim 1 wherein said powder is prebaked at 220° C.

7. A method in accordance with claim 4 wherein said powder is prebaked at 230° C.

* * * * *